United States Patent
Yang et al.

(10) Patent No.: US 12,125,665 B2
(45) Date of Patent: Oct. 22, 2024

(54) ION IMPLANTATION SYSTEM

(71) Applicant: TAIWAN SEMICONDUCTOR MANUFACTURING COMPANY LIMITED, Hsin-Chu (TW)

(72) Inventors: Kai-Yun Yang, Tainan (TW); Chen Chi Wu, Hsinchu (TW); Ching I Li, Tainan (TW); Min-Chang Ching, Zhubei (TW); Hung-Ta Huang, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 344 days.

(21) Appl. No.: 17/742,608

(22) Filed: May 12, 2022

(65) Prior Publication Data
US 2023/0369009 A1    Nov. 16, 2023

(51) Int. Cl.
*H01J 37/08*    (2006.01)
*H01J 37/317*   (2006.01)
*H01J 37/32*    (2006.01)
*H01L 21/265*   (2006.01)

(52) U.S. Cl.
CPC .......... *H01J 37/08* (2013.01); *H01J 37/3171* (2013.01); *H01J 37/32064* (2013.01); *H01L 21/26513* (2013.01)

(58) Field of Classification Search
CPC ................. H01J 37/32064; H01J 37/08; H01J 37/3171; H01J 37/026; H01J 37/077; H01J 2237/0045; H01L 21/26513
USPC ...................................... 250/492.21
See application file for complete search history.

(56) References Cited

U.S. PATENT DOCUMENTS 4,743,767 A * 5/1988 Plumb ..................... H01J 37/24
250/398

\* cited by examiner

*Primary Examiner* — Kiet T Nguyen
(74) *Attorney, Agent, or Firm* — Cooper Legal Group, LLC

(57) ABSTRACT

A plasma flood gun includes a filament to emit first electrons based on a first filament current induced in the filament to heat the filament to a first temperature at a first time. The first electrons interact with an inert gas in an arc plasma chamber to generate a first plasma. A filament resistance meter measures a first filament resistance of the filament, in-situ, during generation of the first plasma. A filament current source adjusts, based on the first filament resistance, the first filament current induced in the filament at the first time to a second filament current induced in the filament at a second time to generate a second plasma in the arc plasma chamber at the second time.

20 Claims, 5 Drawing Sheets

ION IMPLANTATION SYSTEM

BACKGROUND

Ion generation and implantation is useful for doping a semiconductor wafer at controlled depths and dopant concentrations. An ion implanter generally includes an ion source to generate an ion beam and an ion implantation chamber where ion implantation on the semiconductor wafer occurs. The ions may be positively charged and accelerated to bombard the semiconductor wafer, thereby changing the properties (e.g., physical, chemical, and/or electrical properties) of the wafer. For example, in a complementary metal-oxide semiconductor (CMOS) device, regions of different dopant concentrations can be formed by ion implantation. In an ion implantation system, a plasma flood gun may be used in front of the semiconductor wafer. The plasma flood gun may generate and release electrons, which neutralize at least some of the positively charged ion beam before striking the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
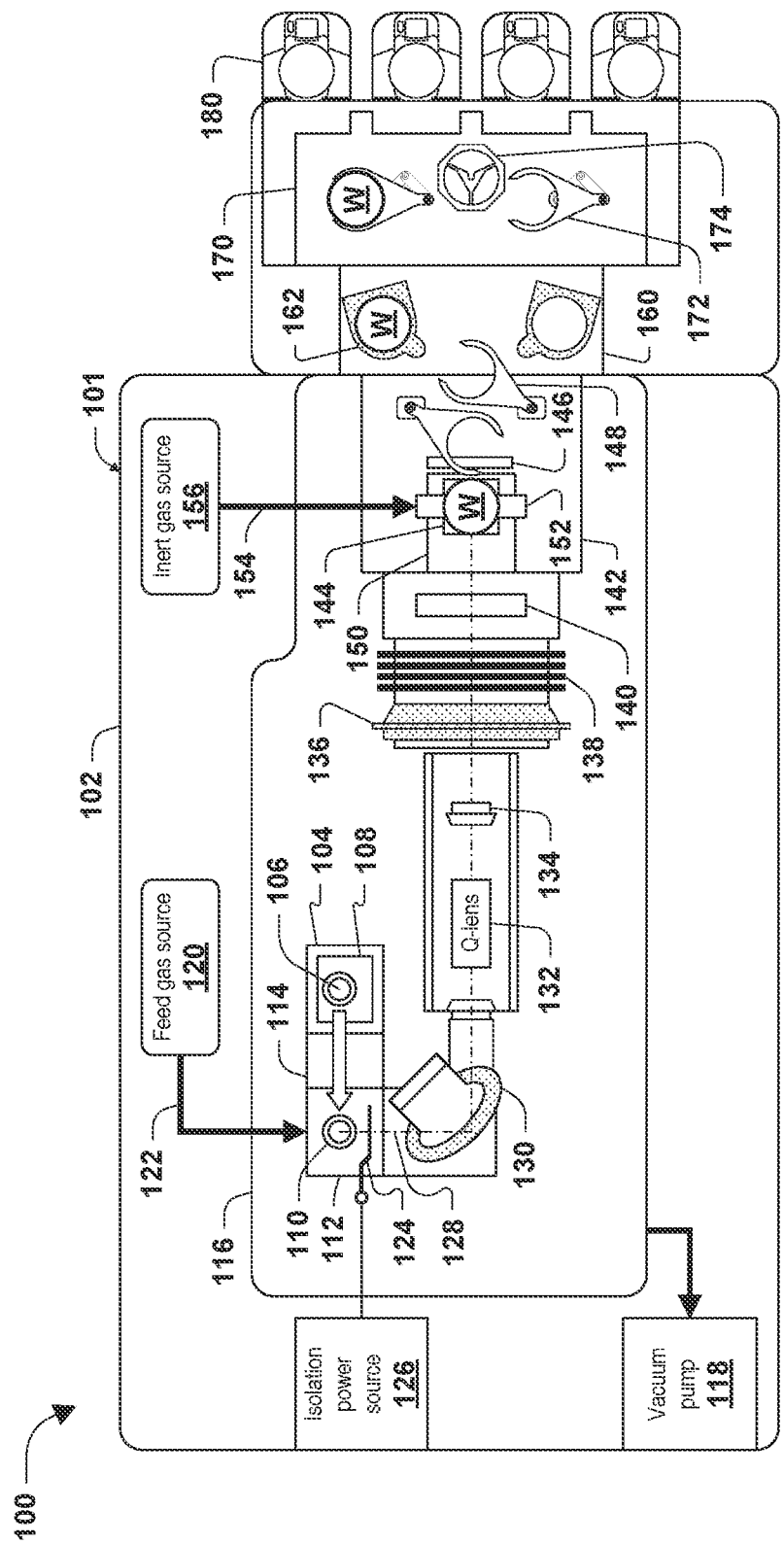
FIG. 1 illustrates an implementation of ion generation for semiconductor fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

In the processing of a semiconductor wafer, ion generation and implantation may be used to dope impurity ions into the semiconductor wafer and change the physical properties of the material. For example, boron may be implanted into silicon to change the electrical properties of the silicon to be more conductive and create a p-n junction or a transistor as a circuit element of a device. An ion beam typically includes positively charged ions that are directed from an ion source toward the semiconductor wafer. A variety of different feed gases may be combined into the ion beam to provide different dopant characteristics. Various molecular ions may be created from the ion source, which are then accelerated toward the semiconductor wafer. A depth of implantation of the ions into the semiconductor wafer may be based on ion implant energy and mass of the ions. One or more types of ion species may be implanted into the semiconductor wafer in different doses and at different energy levels to obtain desired characteristics. Implantation of positively charged ions into the semiconductor wafer may result in a build-up of positive charges, also known as wafer charging, on portions of the wafer surface. Wafer charging may cause non-uniform doping and arcing defects. Electrons may be flooded into the ion beam during implantation to mitigate or neutralize such wafer charging.

According to some embodiments, a plasma flood gun is provided that facilitates flooding of electrons, also known as a plasma or plasma flood, into the ion beam during ion implantation, such as to mitigate or neutralize wafer charging. An arc plasma chamber of the plasma flood gun may receive an inert gas and a filament may be heated in response to a filament current induced in the filament and generate the plasma through interaction and/or collision of emitted electrons from the filament with the inert gas. Typically, the filament loses mass during heating and during generation of the plasma, also known as thinning. Typically, a filament resistance of the filament increases based on the loss of mass. Such loss of filament mass may vaporize within the plasma and provide a source of contamination to the components of an ion implanter tool, the plasma flood gun, and/or the semiconductor wafer. When the filament nears an end of useful life, the filament may dramatically thin, which may result in a dramatic increase in filament resistance, filament temperature, and/or loss of filament mass. The increased filament temperature may increase a rate of degradation of the filament, thereby increasing a rate of contamination. To increase the useful life of the filament and reduce contamination, a filament resistance of the filament is measured, in-situ, within the plasma flood gun. In some embodiments, the filament resistance is measured at operating temperatures and/or during generation of the plasma. A filament current source may then adjust a filament current applied to and/or induced in the filament based on the filament resistance. Such adjustment of the filament current in view of the increased filament resistance may maintain an operating temperature of the filament and mitigate or retard loss of filament mass. Such adjustment of the filament current may reduce contamination by loss of filament mass, and the plasma flood gun may operate in a more predictable and desired manner for a longer duration.

FIG. 1 illustrates an implementation 100 of ion generation for semiconductor fabrication, according to some embodiments. The implementation 100 provides an ion implantation system 101 including an ion implanter tool 102 that may be used for medium current type, high current type, or high energy type ion implantations, according to some embodiments. Medium current type ion implantations are typically used for formation of channels, channel stoppers, and/or wells. High current type ion implantations are typically used for formation of sources and drains of transistors and/or contacts of a device. High energy type ion implantations are typically used for formation of deep wells and/or photodiodes. In some embodiments, the ion implanter tool 102 illustrated in FIG. 1 is a batch wafer type ion implanter tool.

According to some embodiments, the ion implanter tool 102 includes an ion source loading chamber 104 for providing an ion source material 106. The ion source material 106 may be loaded into the ion source loading chamber 104 by opening a chamber door 108 and placing the ion source material 106 on a container 110. In some embodiments, the container 110 includes a crucible. In some embodiments, the container 110 includes a heater (not shown) for evaporation of the ion source material 106. In some embodiments, the container 110 containing the ion source material 106 is moved from the ion source loading chamber 104 to an ion source chamber 112 through a transition tunnel 114 between an external environment and an internal environment of an ion implantation chamber 116. In some embodiments, the internal environment of the ion implantation chamber 116 is a vacuum environment provided by a vacuum pump 118.

According to some embodiments, the ion source chamber 112 is coupled to a feed gas source 120 to receive a feed gas 122. Different feed gases may be supplied to the ion source chamber 112 to generate ions having particular dopant characteristics. For example, feed gases may include Phosphine ($PH_3$), Boron trifluoride ($BF_3$), Arsine ($AsH_3$), or other feed gases. In some embodiments, the feed gas source 120 is configured to supply a reactant gas and a diluent gas into the ion source chamber 112. In some embodiments, the ion source chamber 112 includes an ion extraction electrode 124 that receives power from an isolation power source 126. In some embodiments, the isolation power source 126 is configured as an isolation transformer. In some embodiments, the ion extraction electrode 124 is a hot cathode that is powered by the isolation power source 126 to ionize the feed gas 122 introduced into the ion source chamber 112 to form ions and/or electrons (plasma). In some embodiments, the hot cathode may be a heated filament, an indirectly heated cathode, or other type of hot cathode. In some embodiments, the ions may be extracted from the ion source chamber 112 with the ion extraction electrode 124 in a three extraction electrode configuration to create a desired electric field to focus the ions into an ion beam 128. In some embodiments, an ion beam source includes the ion source material 106, the ion source chamber 112, the ion extraction electrode 124, and/or another component. In some embodiments, the ion source chamber 112 is configured as an arc chamber and the container 110 containing the ion source material 106 is positioned inside the ion source chamber 112 to form the ion beam 128 by heating the ion source material 106 and applying a voltage to the ion extraction electrode 124.

According to some embodiments, the generated ion beam 128 passes into a region covered by magnetic field lines of an analyzer magnet 130 and the analyzer magnet 130 selects appropriate ions based on the desired ion mass and charge by applying and adjusting a magnetic field. In some embodiments, the analyzer magnet 130 has a magnet which may function to pass only ions having a desired charge-to-mass ratio to a resolving aperture. In particular, the analyzer magnet 130 can include a curved path where the ion beam 128 is exposed to the applied magnetic field, which causes ions having the undesired charge-to-mass ratio to be deflected away from the beam path. In some embodiments, the analyzer magnet 130 may apply a Lorentz force to select the appropriate ions for implantation into a semiconductor wafer. Other arrangements and/or configurations of the analyzer magnet 130 are within the scope of the present disclosure.

According to some embodiments, ions in the ion beam 128 that have a desired ion mass and charge pass from the analyzer magnet 130 into a quadrupole lens 132, also known as a Q lens. In some embodiments, the quadrupole lens 132 includes two single quadrupoles turned 90° with respect to each other. In some embodiments, the quadrupole lens 132 may act on the ion beam 128 as a converging lens in one plane and act as a diverging lens in another plane. The focusing properties of the quadrupole lens 132 may be referenced by these two planes, also known as a converging-diverging-converging (CDC) plane and a diverging-converging-diverging (DCD) plane. In some embodiments, the quadrupole lens 132 may provide a different lens strength in each of the two planes. The ion beam 128 may then pass into a region surrounded by a scanning electrode 134. In some embodiments, the scanning electrode 134 uses an electrostatic method to uniformly scan the ion beam 128 throughout an area of a target semiconductor wafer. For example, the scanning electrode 134 may scan the ion beam 128 in a frequency of 100 kHz for each target semiconductor wafer. A scanning pattern of the scanning electrode 134 may depend on a desired outcome of the ion implanted wafers. In some embodiments, the scanning electrode 134 includes at least a pair of horizontal electrodes for controlling horizontal scanning and at least a pair of vertical electrodes for controlling vertical scanning. In some embodiments, the ion beam 128 may be distributed over the target semiconductor wafer by beam scanning from the scanning electrode 134, by semiconductor wafer movement using a wafer supporting structure such as a stage or platen, or by a combination of beam scanning and semiconductor wafer movement. Other arrangements and/or configurations of the quadrupole lens 132 and/or the scanning electrode 134 are within the scope of the present disclosure.

According to some embodiments, the ion beam 128 passes into a region covered by a parallel lens 136, also known as a P-lens. In some embodiments, the quadrupole lens 132 and the parallel lens 136 may function to shape the ion beam 128 and the scanning electrode 134 may function to scan the ion beam to cover an entire width of a target semiconductor wafer. In some embodiments, the ion beam 128 then passes into a region surrounded by an acceleration/deceleration column 138 for adjusting the speed of the ion beam 128. The acceleration/deceleration column 138 may include a plurality of electrodes (e.g., three electrodes) to implant the ions into the semiconductor wafer at a desired energy level. Because the ions lose energy when they collide with electrons and nuclei in the semiconductor wafer, they come to rest at a desired depth within the substrate based on the acceleration energy. In some embodiments, the ion beam 128 then passes into a region covered by magnetic field lines of an angular energy filter 140, also known as a final energy magnet (FEM). In some embodiments, the angular energy filter 140 may function to adjust the energy of the ions for ion implantation into the target semiconductor wafer. Other arrangements and/or configurations of the parallel lens 136, the acceleration/deceleration column 138, and/or the angular energy filter 140 are within the scope of the present disclosure.

According to some embodiments, the ion implanter tool 102 includes a sample chamber 142 to position a semiconductor wafer W for ion implantation. The sample chamber 142 may include a stage 144 to support the semiconductor wafer W for ion implantation. In some embodiments, the stage 144 is configured to the support semiconductor wafer W to face the ion beam 128 adjusted by the angular energy filter 140. In some embodiments, the stage 144 includes a rotating disk to support one or more semiconductor wafers for ion implantation. If the ion beam 128 or a portion of the ion beam 128 misses the semiconductor wafer W and/or the stage 144, the ion beam 128 may be stopped by a beam stopper 146. In some embodiments, semiconductor wafers may be transferred onto the stage 144 by one or more transfer arms, such as a transfer arm 148. Other arrangements and/or configurations of the sample chamber 142 and/or one or more components of the sample chamber 142 are within the scope of the present disclosure.

According to some embodiments, the ion beam 128 may pass through a flood box 150 to receive a plasma shower of electrons, also known as a plasma flood, from a plasma flood gun 152. The plasma flood gun 152 may generate and release electrons, which may interact with and neutralize at least some of the positively charged ion beam before striking the semiconductor wafer W. The plasma flood gun 152 may receive an inert gas 154 from an inert gas source 156. In some embodiments, the inert gas 154 includes a noble gas having a low ionization potential to provide an additional source of electrons for the plasma flood generated by the plasma flood gun 152. For example, the inert gas 154 may include argon (Ar), xenon (Xe), krypton (Kr), or another inert gas, alone or in combination with another inert gas. In some embodiments, the inert gas 154 may be maintained at a gas pressure in a range of 1-50 mTorr. In some embodiments, the plasma flood gun 152 includes a filament, described in greater detail herein, which provides a source of first electrons to interact and/or collide with the inert gas 154 to generate secondary electrons. The first electrons may be accelerated within the plasma flood gun 152 to interact with molecules of the inert gas 154 and eject the secondary electrons therefrom. In some embodiments, the plasma flood includes the secondary electrons, generated through interaction of some of the first electrons and the inert gas 154, which pass from the plasma flood gun 152 into the flood box 150 to interact with the ion beam 128. In some embodiments, the plasma flood includes the first electrons, which pass from the plasma flood gun 152 into the flood box 150 to interact with the ion beam 128. In some embodiments, the plasma flood includes the first electrons and the secondary electrons. In some embodiments, the plasma flood has a lower energy than the ion beam 128. In some embodiments, the filament is provided to emit first electrons based on a first filament current induced in the filament to heat the filament to a first temperature at a first time. The first electrons may interact with the inert gas 154 in an arc plasma chamber of the plasma flood gun 152 to generate a first plasma in the arc plasma chamber at the first time. Other arrangements and/or configurations of the flood box 150 and/or the plasma flood gun 152 are within the scope of the present disclosure.

According to some embodiments, the implementation 100 includes a load lock module 160 to house a plurality of semiconductor wafers, such as the semiconductor wafer W, before and/or after transfer into the sample chamber 142. The load lock module 160 may be configured to generally approximate conditions within the sample chamber 142, to mitigate introduction of media, such as dust, moisture, condensation, contaminants, etc., and/or to mitigate changes in vapor pressure within the sample chamber 142. In some embodiments, the semiconductor wafer W is mechanically transferred from the load lock module 160 into the sample chamber 142 by the transfer arm 148. In some embodiments, the semiconductor wafer W is mechanically transferred from the load lock module 160 into the sample chamber 142 by a wafer support 162. In some embodiments, the wafer support 162 mechanically transfers the semiconductor wafer W from the load lock module 160 onto the stage 144. In some embodiments, the wafer support 162 mechanically transfers the semiconductor wafer W to the transfer arm 148 for placement onto the stage 144. The wafer support 162 of the load lock module may be configured as a robotic arm to transfer the semiconductor wafer W into and/or out of the sample chamber 142. For example, the wafer support 162 may place the semiconductor wafer W onto the stage 144 of the sample chamber 142 and/or retrieve the semiconductor wafer W from the stage 144 of the sample chamber 142. In an example, the load lock module 160 includes the wafer support 162 configured as a cassette or carousel for storing and/or transferring a plurality of wafers including the semiconductor wafer W. The load lock module 160 may include a retractable door (not shown), such as an insulated door, to facilitate transfer of the semiconductor wafer W and to insulate the sample chamber 142 from exterior conditions. In some embodiments, the load lock module 160 may be coupled to a vacuum source, such as the vacuum pump 118, and/or a gas source, such as the inert gas source 156, to approximate conditions within the sample chamber 142. Other arrangements and/or configurations of the load lock module 160 are within the scope of the present disclosure.

According to some embodiments, the implementation 100 includes an interface module 170 to house a plurality of semiconductor wafers, such as the semiconductor wafer W, before and/or after transfer into the load lock module 160. The interface module 170 may be configured as a facility interface, an equipment front end module (EFEM), or other type of interface module. In some embodiments, the interface module 170 includes an operating machine 172, such as a robotic arm, a track based extension member, or other mechanical device. The operating machine 172 may be configured to transfer the semiconductor wafer W between the load lock module 160 and another module for processing. In some embodiments, the interface module 170 includes a notch aligner 174 to align the semiconductor wafers for processing. The notch aligner 174 may include a sensor (not shown), such as an optical sensor, to determine notch positions of semiconductor wafers and provide correct alignment during processing. The notch aligner 174 may include an optical diffuser (not shown) to mitigate disruptive optical reflections from the semiconductor wafer W for sensing of a notch position by the sensor. In some embodiments, the interface module 170 includes a fan filter unit (not shown) to create and/or maintain a mini environment within the interface module 170. The fan filter unit may draw air through a top portion thereof by a fan unit, which is then filtered by a filter unit for introduction into the interface module 170. In some embodiments, air from within the interface module 170 may be exhausted through a bottom portion thereof from a vacuum source, such as the vacuum pump 118. Other arrangements and/or configurations of the interface module 170 are within the scope of the present disclosure.

According to some embodiments, the implementation 100 includes one or more wafer storage devices, such as a wafer storage device 180, to house a plurality of semiconductor wafers, such as the semiconductor wafer W, before and/or after transfer to interface module 170. The wafer storage device 180 may be configured as a standard mechanical interface (SMIF) or a front opening unified pod (FOUP) to retain a plurality of semiconductor wafers therein. The wafer storage device 180 may be loaded onto a load port to provide an ultra-clean environment within the wafer storage device 180. For example, a cleaning gas may be added to the wafer storage device 180 by the load port through a gas inlet and the cleaning gas may be exhausted from the wafer storage device 180 through a gas outlet. Other arrangements and/or configurations of the wafer storage device 180 are within the scope of the present disclosure.

Figure 2:
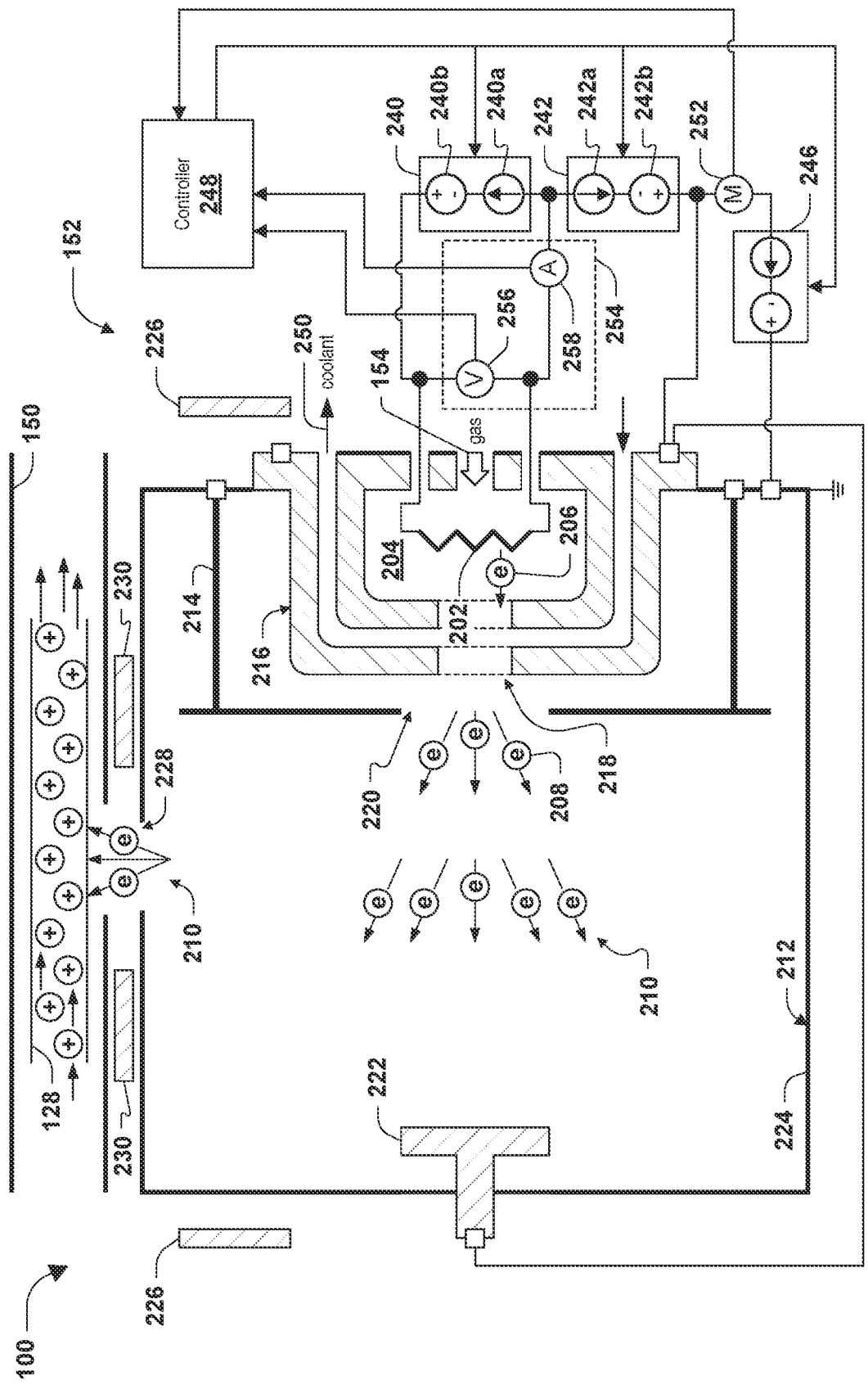
FIG. 2 illustrates an implementation of ion generation using a plasma flood gun, according to some embodiments.

FIG. 2 illustrates an implementation 100 of ion generation using the plasma flood gun 152, according to some embodiments. In some embodiments, the plasma flood gun 152 includes a filament 202 that is at least partially surrounded by an arc plasma chamber 204 to emit electrons 206 based on a filament current induced in the filament 202 to heat the filament 202. The electrons 206 may interact and/or collide with the inert gas 154 to generate ejected electrons 208 through secondary electron emission. The electrons 206 emitted from the filament 202 and/or the ejected electrons 208 from the inert gas 154 form a plasma 210 within a confining chamber 212 of the plasma flood gun 152. In some embodiments, the electrons 206 and/or the ejected electrons 208 are directed into the confining chamber 212 by an extraction plate 214. In some embodiments, the electrons 206 emitted from the filament 202 may be characterized as first electrons and the ejected electrons 208 from the inert gas 154 may be characterized as secondary electrons. In some embodiments, the plasma 210 includes first electrons and secondary electrons. In some embodiments, the first electrons interact with the inert gas 154 within the arc plasma chamber 204 such that a first component of the plasma 210 is the secondary electrons. Quantitatively, the plasma 210 may be characterized by a secondary electron emission yield, which may be defined as a number of secondary electrons released by a single first electron. The secondary electron emission yield may depend upon the nature of the particle (e.g., an electron), mass of the particle, electric charge state of the particle, energy of the particle, and an angle of incidence between the particle and a molecule of the inert gas 154. The secondary electron emission yield may also depend upon environmental conditions of the plasma flood gun 152, such as component surface materials, component structures, temperature, component cleanliness conditions, etc.

In some embodiments, the plasma flood gun 152 includes a chamber housing 216 to at least partially surround the filament 202 and define the arc plasma chamber 204. In some embodiments, the chamber housing 216 defines a chamber housing aperture 218 to direct the plasma 210 from the arc plasma chamber 204 into the confining chamber 212. In some embodiments, the extraction plate 214 defines an extraction electrode aperture 220 to direct the plasma 210 from the arc plasma chamber 204 into the confining chamber 212. In some embodiments, a repelling electrode 222 (also known as an anticathode) is coupled to an interior portion of the confining chamber 212. As illustrated in FIG. 2, the chamber housing 216 may be positioned at one side of the confining chamber 212 and the repelling electrode 222 may be positioned at an opposite side of the confining chamber 212. In some embodiments, the repelling electrode 222 may be biased at the same or a similar potential as the chamber housing 216 to repel energetic electrons provided in the confining chamber 212. The repelling electrode 222 may be formed from a conductive material, such as tungsten, graphite, and/or another conductive material, where the conductive material may be formed alone or in combination with other materials, such as a conductive metal or alloy.

According to some embodiments, interior portions of the confining chamber 212, such as a sidewall 224, may be made out of a non-metallic conductive material such as graphite or silicon carbide (SiC). In some embodiments, interior portions of the confining chamber 212 may have a coating of a non-metallic conductive material (e.g., graphite or SiC). The coating may be applied over either a metal or non-metal surface. In some embodiments, interior portions of the confining chamber 212 may include exposed aluminum (Al) or aluminum-containing materials (e.g., aluminum oxide, $Al_2O_3$, etc.). In some embodiments, one portion of the interior surface of the confining chamber 212 may be coated with a non-metallic conductive material while another portion may comprise exposed aluminum or aluminum-containing materials. In some embodiments, a vacuum or partial vacuum is created inside the confining chamber 212. For example, the vacuum or partial vacuum may be created by the vacuum pump 118 illustrated in FIG. 1. In some embodiments, the inert gas 154 may be introduced into the arc plasma chamber 204 in combination with creation of the vacuum or partial vacuum within the confining chamber 212 to maintain the gas pressure within the confining chamber 212, as set forth in greater detail herein.

According to some embodiments, the implementation 100 includes source magnets 226 that are provided outside of the confining chamber 212. In some embodiments, the source magnets 226 are configured as part of the plasma flood gun 152. In some embodiments, the source magnets 226 are configured to produce a magnetic field within the confining chamber 212 to confine and/or direct the energetic electrons forming the plasma 210. Although two source magnets are illustrated in FIG. 2, a single source magnet, or more than two source magnets may be utilized for generating the magnetic field within the confining chamber 212, in accordance with some embodiments.

According to some embodiments, the plasma flood gun 152 emits the plasma 210 from the confining chamber 212 into the flood box 150 through a confining chamber aperture 228 to interact with the ion beam 128. In some embodiments, the implementation 100 includes extraction electrodes 230 that are positioned in front of the confining chamber aperture 228 and outside of the confining chamber 212. In some embodiments, the extraction electrodes 230 are configured as part of the plasma flood gun 152. The extraction electrodes 230 may be configured to extract the plasma 210 from the confining chamber 212 into the flood box 150 for interaction with the ion beam 128. In some embodiments, the plasma 210 has a lower energy than the ion beam 128.

According to some embodiments, the plasma flood gun 152 includes a filament power source 240 electrically coupled to the filament 202, a bias power source 242 electrically coupled between the filament power source 240 and the chamber housing 216, and an extraction power source 246 coupled between the bias power source 242 and the confining chamber 212. In some embodiments, the plasma flood gun 152 includes a controller 248 in operable communication with the filament power source 240, the bias power source 242, and the extraction power source 246. For example, the controller 248 may supply control signals to control the power sources. In some embodiments, the chamber housing 216 may be cooled by a cooling system. In some embodiments, a coolant 250 may continuously pass through one or more conduits defined in chamber housing 216 to provide cooling of the chamber housing 216 from heat generated by the filament 202. In some embodiments, the coolant 250 is water or another type of coolant.

According to some embodiments, the filament power source 240 includes a filament current source 240a to induce a filament current in the filament 202 and a filament voltage source 240b to apply a filament voltage across the filament 202. The filament 202 may emit electrons 206 based on the filament current induced in the filament 202 to heat the filament to a temperature, where the electrons 206 interact with the inert gas 154 in the arc plasma chamber 204 to generate the plasma 210 in the arc plasma chamber 204. In some embodiments, the bias power source 242 includes a bias current source 242a and a bias voltage source 242b. The bias voltage source 242b may apply a bias voltage between the filament 202 and the chamber housing 216, defining the arc plasma chamber 204, wherein the chamber housing 216 directs the electrons into the confining chamber 212 based on the bias voltage. In some embodiments, the bias voltage source 242b may apply a negative potential to the filament 202. In some embodiments, the extraction power source 246 may apply an extraction voltage between the chamber housing 216 and the extraction plate 214 coupled to the confining chamber 212, wherein the extraction plate 214 directs the electrons 206 into the confining chamber 212 based on the extraction voltage.

According to some embodiments, at least some of the power sources, such as the filament power source 240, the bias power source 242, and/or the extraction power source 246, are direct current (DC) power supplies, which can include a rectifier for converting alternating current (AC) to DC, and a transformer. In some embodiments, the filament 202 is a coil filament, such as a Bernas style filament. In some embodiments, the filament 202 is a metallic material, such as tungsten, aluminum, molybdenum, another suitable metal, a metal alloy, or combination thereof.

According to some embodiments, the filament power source 240 includes the filament current source 240a configured as an adjustable current source. In some embodiments, the filament power source 240 includes the filament voltage source 240b configured as an adjustable voltage source. In some embodiments, the filament current source 240a is configured to adjust the current induced in the filament 202 in response to one or more control signals from the controller 248. In some embodiments, the filament current source 240a may supply a current in a range of 0-250 A and a voltage in a range of 1-50 V. In some embodiments, the voltage provided by the filament power source 240 may be a negative voltage with reference to the bias power source 242. For example, in some embodiments, the filament power source 240 may supply up to about 200 A at voltages between −2 and −5 V DC. In some embodiments, the filament power source 240 may supply voltages in the range from 1-50 V. For example, in some embodiments, the filament power source 240 may provide 80 A of current and 3 V of voltage. In some embodiments, a maximum output of the filament power source 240 may be about 800 watts (W) at 10 V of DC voltage and 120 A of current. Other arrangements and/or configurations of currents and/or voltages output by the filament power source 240 are within the scope of the present disclosure.

According to some embodiments, the bias power source 242 provides power to control thermionic electron emission from the filament 202. In some embodiments, the bias power source 242 includes a bias current source 242a and a bias voltage source 242b. In some embodiments, the bias current source 242a is an adjustable current source. In some embodiments, the bias voltage source 242b is an adjustable voltage source. In some embodiments, the power output by the bias power source 242, e.g., current and voltage, is monitored by a power meter 252 and communicated to the controller 248 for feedback control of the bias power source 242. In some embodiments, the bias power source 242 is configured to adjust output power therefrom in response to one or more control signals from the controller 248. In some embodiments, the bias voltage source 242b biases the chamber housing 216 to a positive voltage relative to the filament 202. For example, the bias voltage source 242b may bias the chamber housing 216 relative to the filament 202 between 0-60 V, such as about 30 V. In some embodiments, the bias power source 242 may provide about 10 A of current and 20 V of voltage. In some embodiments, a maximum output from the bias power source 242 may be about 800 W at 10 V of DC voltage and 120 A of current. In some embodiments, a maximum output of from the bias power source 242 may be about 50 V of DC voltage and 40 A of current. Other arrangements and/or configurations of currents and/or voltages output by the bias power source 242 are within the scope of the present disclosure.

According to some embodiments, the extraction power source 246 is coupled between the chamber housing 216 and the confining chamber 212. As set forth herein, the extraction plate 214 may be coupled to the confining chamber 212 at the same voltage or may be coupled to the confining chamber 212 at an extraction voltage to direct the electrons 206 into the confining chamber 212. In some embodiments, the extraction power source 246 is configured to adjust output power therefrom in response to one or more control signals from the controller 248. In accordance with some embodiments, the extraction power source 246 is configured to bias the chamber housing 216 with respect to confining chamber 212 and/or the extraction plate 214 so that the electrons 206 are accelerated at a high energy in the arc plasma chamber 204. In accordance with the above, the electrons 206 may be accelerated to form the plasma 210 within the arc plasma chamber 204 and/or the confining chamber 212. Other arrangements and/or configurations of the extraction power source 246 are within the scope of the present disclosure.

According to some embodiments, the plasma flood gun 152 includes a filament resistance meter 254 to measure a filament resistance of the filament 202, in-situ, during generation of the plasma 210. In some embodiments, the filament current source 240a may adjust, based on the first filament resistance, the filament current induced in the filament 202. In some embodiments, the filament resistance meter 254 is configured to output the filament resistance to the controller 248. In some embodiments, the plasma flood gun 152 includes a filament voltage meter 256 to measure a filament voltage across the filament 202, in-situ, during generation of the plasma 210. In some embodiments, the plasma flood gun 152 includes a filament current meter 258 to measure the filament current induced in the filament 202, in-situ, during generation of the plasma 210. In some embodiments, the filament resistance meter 254 includes the filament voltage meter 256 and the filament current meter 258. In some embodiments, the plasma flood gun 152 includes one or both of the filament voltage meter 256 or the filament current meter 258. In some embodiments, the filament voltage meter 256 and/or the filament current meter 258 may provide output measurements to the controller 248.

According to some embodiments, the filament 202 may be made from tungsten. In some embodiments, the tungsten filament may be heated to an operating temperature between about 1800° C. and 3000° C., such as between about 2200° C. and 2400° C., or about 2300° C. The tungsten filament may become consumed during operation based on the temperature. Consumption of the tungsten filament may be determined based on vapor pressure of the tungsten when heated to a particular temperature. For example, tungsten heated to a temperature of about 2200° C. may correspond to a tungsten vapor pressure of about $6 \times 10^{-9}$ mm of Hg, indicating a low consumption of tungsten. Tungsten heated to an operating temperature of about 2600° C. may correspond to a tungsten vapor pressure of about $1 \times 10^{-6}$ mm of Hg, indicating a higher consumption of tungsten than at a temperature of about 2200° C. When tungsten is heated above an operating temperature of about 2600° C., a rate that tungsten may be consumed may increase. For example, tungsten heated to a temperature of about 2700° C. may correspond to a vapor pressure of about $4 \times 10^{-6}$ mm of Hg, indicating a higher consumption of tungsten than at a temperature of about 2600° C. Tungsten heated to a temperature of about 2800° C. may correspond to a vapor pressure of about $1 \times 10^{-5}$ mm of Hg, indicating a higher consumption of tungsten than at a temperature of about 2700° C. Tungsten has a melting point of about 3400° C. at atmospheric pressure. Tungsten heated to a temperature exceeding 3000° C., such as between 3000° C. and 3400° C. may result in dramatic consumption of tungsten in a tungsten filament. Consumption of a tungsten filament heated to a high temperature, such as above 3000° C. may result in contamination of the plasma 210, which may damage the semiconductor wafer W and/or contaminate components of the implementation 100, such as the plasma flood gun 152, the sample chamber 142, and/or other components of the implementation 100.

According to some embodiments, the filament 202 may emit the electrons 206 as a thermionic current, such as within the arc plasma chamber 204. The thermionic current j may be determined according to Equation 1, as follows:

$$j = AT^2 e^{\frac{-W}{kT}} \quad \text{Equation 1}$$

where j is the emission current density of the thermionic current, A is material-specific thermionic emission constant (also known as the Richardson constant), T is the temperature of the metal, W is the work function of the metal, and k is the Boltzmann constant. Operating temperature of the filament 202 may correspond to the filament current induced in the filament 202 by the filament current source 240a and the resistance of the filament. Heat generated by the filament 202 may correspond to the filament current, the filament resistance, and the time that the filament current flows through the filament 202. The heat generated by the filament 202 may be determined according to Equation 2, as follows:

$$H = \frac{I^2 Rt}{4.18} = 0.24 I^2 Rt \quad \text{Equation 2}$$

where H is the heat generated by the filament in joules, I is the filament current in A, R is the filament resistance in Ohms, t is the time of filament current flowing through the filament, and 4.18 is a conversion factor where 1 calorie=4.18 joule. The filament resistance may change as a function of temperature according to Equation 3 as follows:

$$\frac{R_2}{R_1} = \frac{\frac{1}{a_0} + t_2}{\frac{1}{a_0} + t_1} \quad \text{Equation 3}$$

where $R_1$ is the filament resistance at temperature $t_1$, $R_2$ is the filament resistance at temperature $t_2$, and $a_0$ is the resistance-temperature coefficient (e.g., tungsten $a_0$=222.22/° C.).

It has been observed that a level of tungsten contaminate $W_C$ may increase with aging of a tungsten filament. The filament resistance of a tungsten filament may increase due to thinning of the tungsten filament. For example, thinning of the tungsten filament has been observed in a working time of less than 100 hours. Such an increase in the tungsten filament resistance increases the heat generated by the tungsten filament, which may increase degradation of the tungsten filament, and causes an increase in tungsten contaminate $W_C$ present in vapor surrounding the tungsten filament. It has been observed that after 4 days of operation of a tungsten filament, a level of tungsten contaminate $W_C$ may be about 0.015E10 atoms per square centimeter (at/cm$^2$). Further observations provide: after 13 days, $W_C$ may be about 0.018E10 at/cm$^2$; after 18 days, $W_C$ may be about 0.020E10 at/cm$^2$; and after 25 days, We may be about 0.025E10 at/cm$^2$. A typical filament resistance of a tungsten filament may increase from about 0.105 Ohms after 4 days to about 0.113 Ohms after 25 days. A typical filament resistance of a tungsten filament may change from an original resistance of about 3% after 4 days to about 7.5% after 25 days. A typical tungsten filament may lose about 27 mg/day through tungsten evaporation, which may contribute to filament thinning and increase in filament resistance. A typical tungsten filament, without monitoring and correction of the tungsten filament current, may experience about a ten-fold increase in tungsten evaporation based on a temperature increase from about 2300° C. to about 2500° C.

According to some embodiments, a filament current induced in the filament 202 by the filament current source 240a of the plasma flood gun 152 may be controlled over a useful life of the filament 202. In some embodiments, the filament current may be controlled according to Equation 4 as follows:

$$R_i I_i^2 = R_a I_a^2 \quad \text{Equation 4}$$

where $R_i$ is the initial filament resistance, $I_i$ is the initial filament current, $R_a$ is the aged filament resistance, $I_a$ is the aged filament current, $R_i I_i^2$ is a first product, and $R_a I_a^2$ is a second product. According to some embodiments, the controller 248 may control the filament current source 240a to adjust the aged filament current $I_a$. For example, the filament current source 240a may adjust a first filament current (e.g., a first aged filament current $I_{a1}$) to a second filament current (e.g., a second aged filament current $I_{a2}$). In this example, the filament current source 240a may adjust the first filament current such that, according to Equation 4, a first product (e.g., $R_i I_i^2$) equals a second product (e.g., $R_a I_a^2$).

According to some embodiments, the initial filament resistance $R_i$ and the initial filament current $I_i$ of the filament 202 may be determined, as set forth herein, after the filament power source 240 and the bias power source 242 have been adjusted to emit the electrons 206 from the filament 202 to create the plasma 210. In some embodiments and after the filament 202 has operated for a period of time, the aged filament resistance $R_a$ and the aged filament current $I_a$ may be determined, as set forth herein, and the aged filament current $I_a$ may be adjusted to satisfy Equation 4. In some embodiments and during operation of the filament 202, as set forth herein, the aged filament resistance $R_a$ and the aged filament current $I_a$ may be continuously determined and the aged filament current $I_a$ may be adjusted to satisfy Equation 4. For example, the filament resistance may be measured by the filament resistance meter 254, the current induced in the filament 202 may be measured by the filament current meter 258, and the controller 248 may control the filament current source 240a according to Equation 4, as set forth above. Other arrangements and/or configurations of the filament power source 240, the bias power source 242, the extraction power source 246, and/or the controller 248 are within the scope of the present disclosure.

According to some embodiments and Equations 1-4, the plasma flood gun 152 may be configured to operate at different times, with different currents, and with different temperatures. The filament 202 may emit first electrons based on a first filament current induced in the filament 202 to heat the filament 202 to a first temperature at a first time. The first electrons may interact with the inert gas 154 in the arc plasma chamber 204 to generate a first plasma in the arc plasma chamber 204 at the first time. The filament resistance meter 254 may measure a first filament resistance of the filament 202, in-situ, during generation of the first plasma at the first time. The filament current source 240a may adjust, based on the first filament resistance, the first filament current induced in the filament 202 at the first time to a second filament current induced in the filament 202 at a second time to generate a second plasma in the arc plasma chamber 204 at the second time. According to some embodiments, the filament 202 has a second filament resistance at the second time, and the filament current source 240a adjusts the first filament current to the second filament current based on a comparison of the first filament resistance and a third filament resistance of the filament at a third time. According to some embodiments, the filament resistance meter 254 includes the filament voltage meter 256 to measure a first filament voltage across the filament 202, in-situ, at the first time, and a filament current meter 258 to measure the first filament current, in-situ, at the first time. The first filament resistance may be based on the first filament voltage and the first filament current.

According to some embodiments and Equations 1-4, the controller 248 may be configured to control the filament current source 240a to induce a third filament current in the filament 202 at a third time, prior to the first time, to generate a third plasma in the arc plasma chamber 204 at the third time, wherein the filament 202 has a second filament resistance at the second time. The controller 248 may be configured to store a third filament resistance of the filament 202 at the third time and control the filament current source 240a to adjust, based on the first filament resistance and the third filament resistance, the first filament current to the second filament current. According to some embodiments, the controller 248 may be configured to calculate a first product of the first filament resistance and a square of the first filament current, calculate a second product of the third filament resistance and a square of the third filament current, and control the filament current source 240a to adjust the first filament current to the second filament current based on the first product and the second product.

According to some embodiments and Equations 1-4, a number of electrons emitted from the filament 202 is a function of a temperature of the filament 202, an amount of plasma 210 generated in the arc plasma chamber 204 is a function of the number of electrons emitted from the filament 202, and the filament current source 240a adjusts the first filament current to the second filament current to change the temperature of the filament from the first temperature to a second temperature. According to some embodiments, the filament resistance of the filament 202 increases during generation of the plasma 210 in the arc plasma chamber 204, and the filament current source 240a lowers a filament current induced in the filament 202 responsive to an increase in the filament resistance. According to some embodiments, the filament 202 generates the plasma 210 when heated to an operating temperature, the filament loses mass during generation of the plasma 210, the filament resistance of the filament 202 increases as the filament loses mass, and the filament current source 240a lowers a filament current induced in the filament 202 responsive to an increase in the filament resistance to maintain the filament 202 at the operating temperature.

According to some embodiments, a filament resistance of the filament increases (e.g., a filament resistance of the filament 202 increases from a filament resistance $R_1$ at a temperature $t_1$ to a filament resistance $R_2$ at a temperature $t_2$) during generation of the plasma 210 in the arc plasma chamber 204, and the filament current source 240a lowers a filament current induced in the filament 202 responsive to an increase in the filament resistance. According to some embodiments, the filament 202 generates the plasma 210 when heated to an operating temperature, the filament 202 loses mass during generation of the plasma 210, and a filament resistance of the filament 202 increases as the filament loses mass. In some embodiments, the filament current source 240a lowers a filament current induced in the filament 202 responsive to an increase in the filament resistance to maintain the filament 202 at the operating temperature. Other arrangements and/or configurations of the plasma flood gun 152 based on Equations 1-4 are within the scope of the present disclosure.

Figure 3:
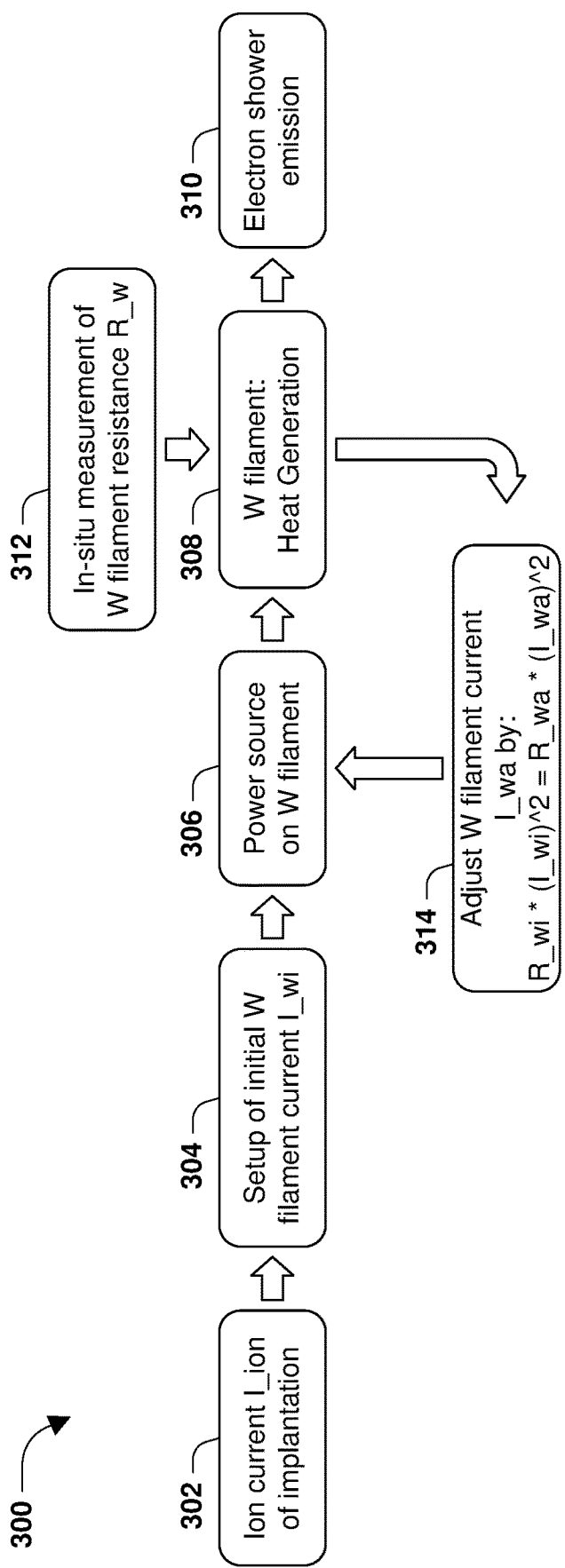
FIG. 3 illustrates an example method, according to some embodiments.

FIG. 3 illustrates an example method, according to some embodiments. According to some embodiments, a method 300 is provided for the plasma flood gun 152 during ion implantation of the implementation 100. At 302 and according to some embodiments, an ion current I_ion may be provided within the ion implantation chamber 116 for ion implantation into the semiconductor wafer W. The ion source material 106 in the ion source chamber 112 may emit the ion beam 128, which may then pass into a region covered by magnetic field lines of the analyzer magnet 130 to select appropriate ions based on the desired ion mass and charge. The ion beam 128 may pass through a region of the quadrupole lens 132 and a region surrounded by the scanning electrode 134. The ion beam 128 may then pass into a region covered by the parallel lens 136 and into a region surrounded by the acceleration/deceleration column 138 for adjusting the speed of the ion beam 128. The ion beam 128 may then pass through the angular energy filter 140, where energy of the ions in the ion beam 128 are adjusted and the ion current I_ion is formed from the ion beam 128 for ion implantation into the semiconductor wafer W. When parameters of the implementation 100 are properly configured based on the desired ion current I_ion, the plasma flood gun 152 may be configured.

At 304 and according to some embodiments, the plasma flood gun 152 may be configured through a setup of an initial tungsten filament current, I_wi, within the arc plasma chamber 204, according to Equation 1, to generate the plasma 210. In some embodiments, the initial tungsten filament current, I_wi, may be set by a configuration of the filament power source 240, the bias power source 242, and the extraction power source 246. The initial tungsten filament current, I_wi, may be set based on the initial tungsten filament resistance $R_i$ and the desired temperature of the filament 202 (e.g., about 2300° C.). At 306 and according to some embodiments, the filament power source 240 may apply power to the tungsten filament to generate the plasma 210 within the arc plasma chamber 204 and the confining chamber 212. At 308 and according to some embodiments, the initial tungsten filament current, I_wi, is induced in the tungsten filament and the tungsten filament generates heat, according to Equation 2, and at an initial temperature $t_1$, according to Equation 3. At 310 and according to some embodiments, the plasma 210 may be emitted from the confining chamber 212 into the flood box 150 through a confining chamber aperture 228 to interact with the ion beam 128 as an electron shower emission.

At 312 and according to some embodiments, the tungsten filament resistance, R_w, may be measured by the filament resistance meter 254, in-situ, during heating of the tungsten filament and generation of the plasma 210. In some embodiments, measurement of the tungsten filament resistance, R_w, may provide an indication of the useful life of the tungsten filament, an indication of loss of mass of the tungsten filament during generation of the plasma, and/or an indication of contamination of the plasma 210 through vaporization of the tungsten filament. In some embodiments, the tungsten filament resistance, R_w, and/or a tungsten filament voltage, V_w, may be indexed by the controller 248 to monitor health, status, and/or useful life of the tungsten filament. In some embodiments, the tungsten filament resistance, R_w, may provide an indication of filament temperature according to Equations 1-4 set forth above. In some embodiments, the tungsten filament resistance, R_w, may be monitored by the controller 248 to provide a warning condition indicating that the tungsten filament temperature is exceeding a preferred operating temperature (e.g., about 2300° C.).

At 314 and according to some embodiments, the aged tungsten filament current, I_wa, may be adjusted according to Equation 4. In some embodiments, adjustment of the aged tungsten filament current, I_wa, may be adjusted downward to reduce the tungsten filament current induced in the tungsten filament due to thinning. In some embodiments, during thinning of the tungsten filament, the initial tungsten filament resistance, R_wi, increases to an aged tungsten filament resistance, R_wa, resulting in an increase in temperature of the tungsten filament according to Equation 3, as set forth above. In some embodiments, adjustment of the aged tungsten filament current, I_wa, downward according to Equation 4 may maintain an operating temperature of the tungsten filament (e.g., about 2300° C.). In some embodiments, adjustment of the aged tungsten filament current, I_wa, downward according to Equation 4 may maintain emission of the thermionic current according to Equation 1. In some embodiments, adjustment of the aged tungsten filament current, I_wa, downward according to Equation 4 may maintain the heat generated by the tungsten filament according to Equation 2. Other arrangements and/or configurations for operating the plasma flood gun 152 during ion implantation of the implementation 100 are within the scope of the present disclosure.

Figure 4:
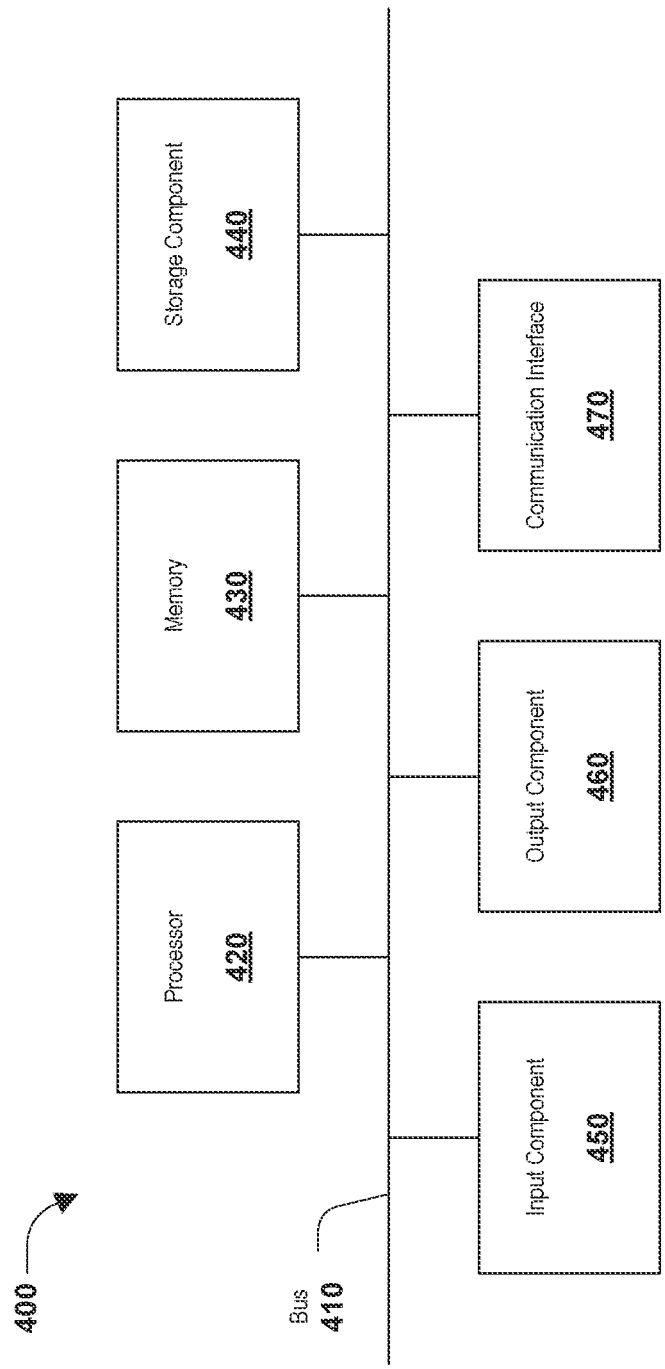
FIG. 4 illustrates example components of a device, according to some embodiments.

FIG. 4 illustrates example components of a device 400, according to some embodiments. According to some embodiments, the device 400 may correspond to the controller 248. As illustrated in FIG. 4, the device 400 may include a bus 410, a processor 420, a memory 430, a storage component 440, an input component 450, an output component 460, and a communication interface 470. The bus 410 may include a component that permits communication among the components of the device 400. The processor 420 may be implemented in hardware, firmware, or a combination of hardware and software. The processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), another type of processing component, or a combination thereof. In some implementations, the processor 420 includes one or more processors capable of being programmed to perform a function. The memory 430 may include a random access memory (RAM), a read only memory (ROM), and/or another type of dynamic or static storage device (e.g., a flash memory, a magnetic memory, and/or an optical memory) that stores information and/or instructions for use by the processor 420.

The storage component 440 stores information and/or software related to the operation and use of the device 400. For example, the storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 450 includes a component that permits the device 400 to receive information, such as via user input (e.g., a touch screen display, a keyboard, a keypad, a mouse, a button, a switch, and/or a microphone). Additionally, or alternatively, the input component 450 may include a sensor for sensing information (e.g., a global positioning system (GPS) component, an accelerometer, a gyroscope, an actuator, and/or another type of sensor). The output component 460 may include a component that provides output information from device 400 (e.g., a display, a speaker, and/or one or more light-emitting diodes (LEDs)). The communication interface 470 includes a transceiver-like component (e.g., a transceiver and/or a separate receiver and transmitter) that enables the device 400 to communicate with other devices, such as via a wired connection, a wireless connection, or a combination of wired and wireless connections. The communication interface 470 may permit the device 400 to receive information from another device and/or provide information to another device. For example, the communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

The device 400 may perform one or more processes described herein. The device 400 may perform these processes based on the processor 420 executing software instructions stored by a non-transitory computer-readable medium, such as the memory 430 and/or the storage component 440. A computer-readable medium may include a non-transitory memory device. A memory device may include memory space within a single physical storage device or memory space spread across multiple physical storage devices. Software instructions may be read into the memory 430 and/or the storage component 440 from another computer-readable medium or from another device via the communication interface 470. When executed, software instructions stored in the memory 430 and/or the storage component 440 may cause the processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 4 are provided as an example. In practice, the device 400 may include additional components, fewer components, different components, or differently arranged components than those shown in FIG. 4. Additionally, or alternatively, a set of components (e.g., one or more components) of device 400 may perform one or more functions described as being performed by another set of components of the device 400.

Figure 5:
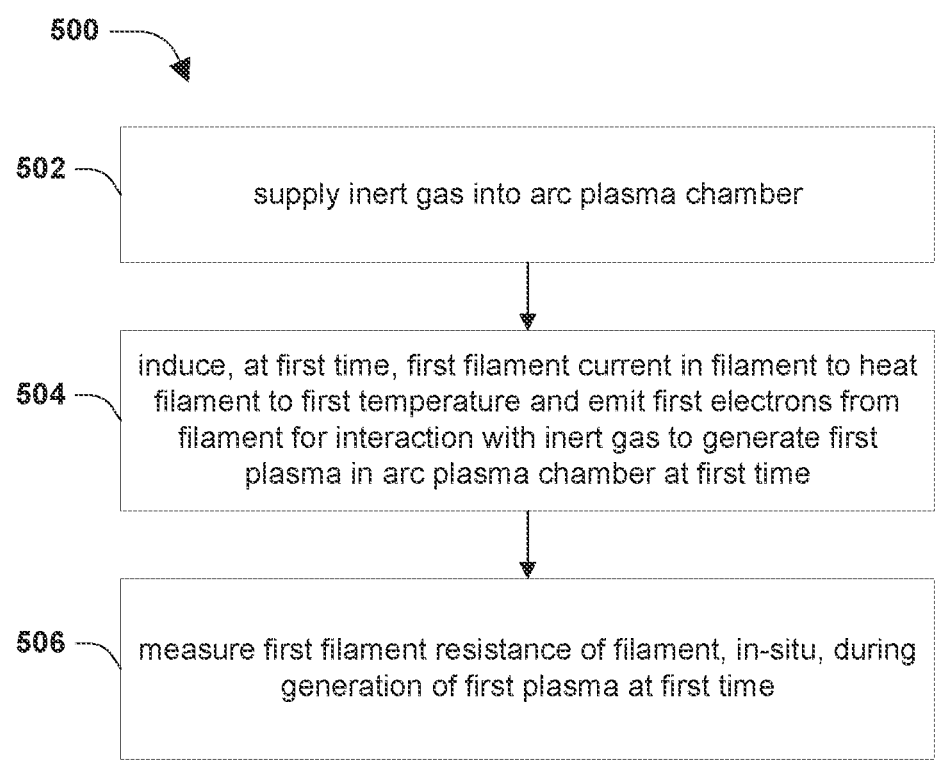
FIG. 5 illustrates an example method, according to some embodiments.

FIG. 5 illustrates an example method 500 of operating a plasma flood gun, according to some embodiments. Some of the operations described can be replaced and/or eliminated for different embodiments. At 502, an inert gas may be supplied into an arc plasma chamber. For example with reference to FIG. 2, the inert gas 154 may be supplied into the arc plasma chamber 204 of the plasma flood gun 152.

At 504, a first filament current may be induced, at a first time, in a filament to heat the filament to a first temperature and emit first electrons from the filament for interaction with the inert gas to generate a first plasma in the arc plasma chamber at the first time. For example, the plasma flood gun 152 may be configured to operate, based on Equations 1-4, such that a first filament current is induced, at a first time, in the filament 202 to heat the filament 202 to a first temperature and emit first electrons from the filament 202 for interaction with the inert gas 154 to generate a first plasma in the arc plasma chamber 204 at the first time.

At 506, a first filament resistance of the filament may be measured, in-situ, during generation of the first plasma at the first time. For example, a first filament resistance of the filament 202 may be measured, in-situ, by the filament resistance meter 254 during generation of the first plasma at the first time. Other and/or additional operations of operating a plasma flood gun are within the scope of the present disclosure.

According to some embodiments, a plasma flood gun is provided. The plasma flood gun includes a filament to emit first electrons based on a first filament current induced in the filament to heat the filament to a first temperature at a first time, where the first electrons interact with an inert gas in an arc plasma chamber to generate a first plasma in the arc plasma chamber at the first time. The plasma flood gun includes a filament resistance meter, electrically coupled in-situ across the filament, to measure a first filament resistance of the filament during generation of the first plasma at the first time. The plasma flood gun includes a filament current source electrically coupled in series with the filament to adjust, based on the first filament resistance, the first filament current induced in the filament at the first time to a second filament current induced in the filament at a second time to generate a second plasma in the arc plasma chamber at the second time.

According to some embodiments, a method of operating a plasma flood gun is provided. The method of operating a plasma flood gun includes supplying an inert gas into an arc plasma chamber, inducing, at a first time, a first filament current in a filament to heat the filament to a first temperature and emit first electrons from the filament for interaction with the inert gas to generate a first plasma in the arc plasma chamber at the first time, and measuring a first filament resistance of the filament, in-situ, during generation of the first plasma at the first time.

According to some embodiments, an ion implantation system is provided. The ion implantation system includes an ion beam source to supply an ion beam for ion implantation into a semiconductor wafer. A plasma flood gun generates a plasma through interaction of electrons emitted from a filament with an inert gas, wherein the plasma interacts with the ion beam to neutralize at least some of a positive charge buildup on the semiconductor wafer from the ion implantation. The controller is electrically coupled to the filament of the plasma flood gun and configured to calculate, in-situ, a filament resistance of the filament from a filament voltage across the filament and a filament current induced in the filament during generation of the plasma.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, ion implantation techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A plasma flood gun, comprising:
   a filament to emit first electrons based on a first filament current induced in the filament to heat the filament to a first temperature at a first time, where the first electrons interact with an inert gas in an arc plasma chamber to generate a first plasma in the arc plasma chamber at the first time;
   a filament resistance meter, electrically coupled in-situ across the filament, to measure a first filament resistance of the filament during generation of the first plasma at the first time; and
   a filament current source electrically coupled in series with the filament to adjust, based on the first filament resistance, the first filament current induced in the filament at the first time to a second filament current induced in the filament at a second time to generate a second plasma in the arc plasma chamber at the second time.

2. The plasma flood gun according to claim 1, wherein:
   the filament has a second filament resistance at the second time, and
   the filament current source adjusts the first filament current to the second filament current based on a comparison of the first filament resistance and a third filament resistance of the filament at a third time.

3. The plasma flood gun according to claim 1, wherein the filament resistance meter comprises:
   a filament voltage meter to measure a first filament voltage across the filament, in-situ, at the first time; and
   a filament current meter to measure the first filament current, in-situ, at the first time, wherein the first filament resistance is based on the first filament voltage and the first filament current.

4. The plasma flood gun according to claim 1, comprising:
   a bias power source to apply a bias voltage between the filament and a chamber housing defining the arc plasma chamber, wherein the chamber housing directs the first electrons into a confining chamber based on the bias voltage.

5. The plasma flood gun according to claim 4, comprising:
   an extraction power source to apply an extraction voltage between the chamber housing and an extraction plate coupled to the confining chamber, wherein the extraction plate directs the first electrons into the confining chamber based on the extraction voltage.

6. The plasma flood gun according to claim 1, comprising:
   a controller configured to:
      control the filament current source to induce a third filament current in the filament at a third time, prior to the first time, to generate a third plasma in the arc plasma chamber at the third time, wherein the filament has a second filament resistance at the second time;
      store a third filament resistance of the filament at the third time; and
      control the filament current source to adjust, based on the first filament resistance and the third filament resistance, the first filament current to the second filament current.

7. The plasma flood gun according to claim 6, wherein the controller is configured to:
   calculate a first product of the first filament resistance and a square of the first filament current;
   calculate a second product of the third filament resistance and a square of the third filament current; and
   control the filament current source to adjust the first filament current to the second filament current based on the first product and the second product.

8. The plasma flood gun according to claim 1, wherein:
   a number of electrons emitted from the filament is a function of a temperature of the filament,
   an amount of plasma generated in the arc plasma chamber is a function of the number of electrons emitted from the filament, and
   the filament current source adjusts the first filament current to the second filament current to change the temperature of the filament from the first temperature to a second temperature.

9. The plasma flood gun according to claim 1, wherein:
   a filament resistance of the filament increases during generation of a plasma in the arc plasma chamber, and
   the filament current source lowers a filament current induced in the filament responsive to an increase in the filament resistance.

10. The plasma flood gun according to claim 1, wherein:
    the filament generates a plasma when heated to an operating temperature,
    the filament loses mass during generation of the plasma,
    a filament resistance of the filament increases as the filament loses mass, and
    the filament current source lowers a filament current induced in the filament responsive to an increase in the filament resistance to maintain the filament at the operating temperature.

11. The plasma flood gun according to claim 1, wherein the filament comprises tungsten and the inert gas comprises argon.

12. A method of operating a plasma flood gun, comprising:
- supplying an inert gas into an arc plasma chamber;
- inducing, at a first time, a first filament current in a filament to heat the filament to a first temperature and emit first electrons from the filament for interaction with the inert gas to generate a first plasma in the arc plasma chamber at the first time; and
- measuring a first filament resistance of the filament, in-situ, during generation of the first plasma at the first time.

13. The method of operating a plasma flood gun according to claim 12, comprising:
- adjusting the first filament current induced in the filament at the first time to a second filament current induced in the filament at a second time to generate a second plasma in the arc plasma chamber at the second time, wherein:
  - the filament has a second filament resistance at the second time, and
  - the first filament current is adjusted to the second filament current based on the first filament resistance and a third filament resistance of the filament at a third time prior to the first time.

14. The method of operating a plasma flood gun according to claim 13, comprising:
- inducing a third filament current in the filament at the third time to generate a third plasma in the arc plasma chamber at the third time;
- calculating a first product of the first filament resistance and a square of the first filament current; and
- calculating a second product of the third filament resistance and a square of the third filament current, wherein:
  - adjusting the first filament current to the second filament current comprises adjusting the first filament current such that the first product equals the second product.

15. The method of operating a plasma flood gun according to claim 13, comprising:
- inducing a third filament current in the filament at the third time to generate a third plasma in the arc plasma chamber at the third time; and
- measuring the third filament resistance of the filament at the third time, wherein:
  - adjusting the first filament current to the second filament current comprises adjusting the first filament current based on a comparison of the first filament resistance and the third filament resistance.

16. The method of operating a plasma flood gun according to claim 12, wherein measuring the first filament resistance comprises:
- measuring a first filament voltage across the filament, in-situ, at the first time;
- measuring the first filament current, in-situ, at the first time; and
- calculating the first filament resistance based on the first filament voltage and the first filament current.

17. The method of operating a plasma flood gun according to claim 12, comprising:
- applying a bias voltage between the filament and a chamber housing defining the arc plasma chamber to direct the first electrons into a confining chamber such that the first plasma is generated in the confining chamber.

18. The method of operating a plasma flood gun according to claim 17, comprising:
- releasing the first plasma from the confining chamber into a flood box to combine with an ion beam directed through the flood box toward a semiconductor wafer, wherein the first plasma includes secondary electrons, generated through interaction of some of the first electrons and the inert gas, for neutralizing at least some of a positive charge buildup on the semiconductor wafer during ion implantation using the ion beam.

19. An ion implantation system, comprising:
- an ion beam source to supply an ion beam for ion implantation into a semiconductor wafer;
- a plasma flood gun to generate a plasma through interaction of electrons emitted from a filament with an inert gas, wherein the plasma interacts with the ion beam to neutralize at least some of a positive charge buildup on the semiconductor wafer from the ion implantation; and
- a controller, electrically coupled to the filament of the plasma flood gun, the controller configured to:
  - calculate, in-situ, a filament resistance of the filament from a filament voltage across the filament and a filament current induced in the filament during generation of the plasma.

20. The ion implantation system according to claim 19, wherein the controller is configured to:
- control a filament current source to adjust the filament current based on the filament resistance.

* * * * *